US008298878B2

(12) United States Patent
Yoo et al.

(10) Patent No.: US 8,298,878 B2
(45) Date of Patent: Oct. 30, 2012

(54) TFT-LCD ARRAY SUBSTRATE AND MANUFACTURING METHOD THEREOF

(75) Inventors: Seongyeol Yoo, Beijing (CN); Seungjin Choi, Beijing (CN); Youngsuk Song, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 344 days.

(21) Appl. No.: 12/784,759

(22) Filed: May 21, 2010

(65) Prior Publication Data

US 2010/0295049 A1    Nov. 25, 2010

(30) Foreign Application Priority Data

May 22, 2009    (CN) .......................... 2009 1 0085506

(51) Int. Cl.
*H01L 21/00* (2006.01)
(52) U.S. Cl. ........................................ 438/149; 438/151
(58) Field of Classification Search .................. 438/149, 438/151, 164, 159, 161
See application file for complete search history.

(56) References Cited

U.S. PATENT DOCUMENTS

| 5,488,005 | A | * | 1/1996 | Han et al. | ...................... | 438/163 |
| 5,915,173 | A | * | 6/1999 | Kwon | ........................... | 438/161 |
| 5,937,283 | A | * | 8/1999 | Lee | ............................... | 438/149 |
| 8,053,289 | B2 | * | 11/2011 | Shingu et al. | ................. | 438/149 |
| 2007/0026585 | A1 | * | 2/2007 | Wong et al. | ................... | 438/151 |
| 2007/0093017 | A1 | * | 4/2007 | Helm et al. | ................... | 438/199 |
| 2007/0161161 | A1 | * | 7/2007 | Chang et al. | .................. | 438/149 |

FOREIGN PATENT DOCUMENTS

JP    06-252171 A    9/1994

* cited by examiner

*Primary Examiner* — Kiesha Bryant
*Assistant Examiner* — Ali Naraghi
(74) *Attorney, Agent, or Firm* — Ladas & Parry LLP (57) ABSTRACT

The embodiment of the invention provides a manufacturing method for a thin film transistor liquid crystal display (TFT-LCD) array substrate, the manufacturing method comprises: step 1, depositing a transparent conductive film, a source/drain metal film and a doped semiconductor film on a transparent substrate sequentially, forming patterns of a doped semiconductor layer, a source electrode and a drain electrode of a thin film transistor, a data line and a pixel electrode by a first patterning process, wherein the doped semiconductor layer remains on the source electrode and the drain electrode; Step 2, depositing a semiconductor film on the whole transparent substrate after Step 1, forming a pattern of a semiconductor layer which includes a channel of the thin film transistor by a second patterning process; Step 3, depositing an insulating film and a gate metal film on the whole transparent substrate after Step 2, forming patterns of a gate line and a gate electrode of the thin film transistor by a third patterning process, wherein the gate electrode is located above the channel of the thin film transistor.

20 Claims, 7 Drawing Sheets

TFT-LCD ARRAY SUBSTRATE AND MANUFACTURING METHOD THEREOF

BACKGROUND

Embodiments of the present invention relates to a thin film transistor liquid crystal display (TFT-LCD) array substrate and a manufacturing method thereof.

Figure 1:
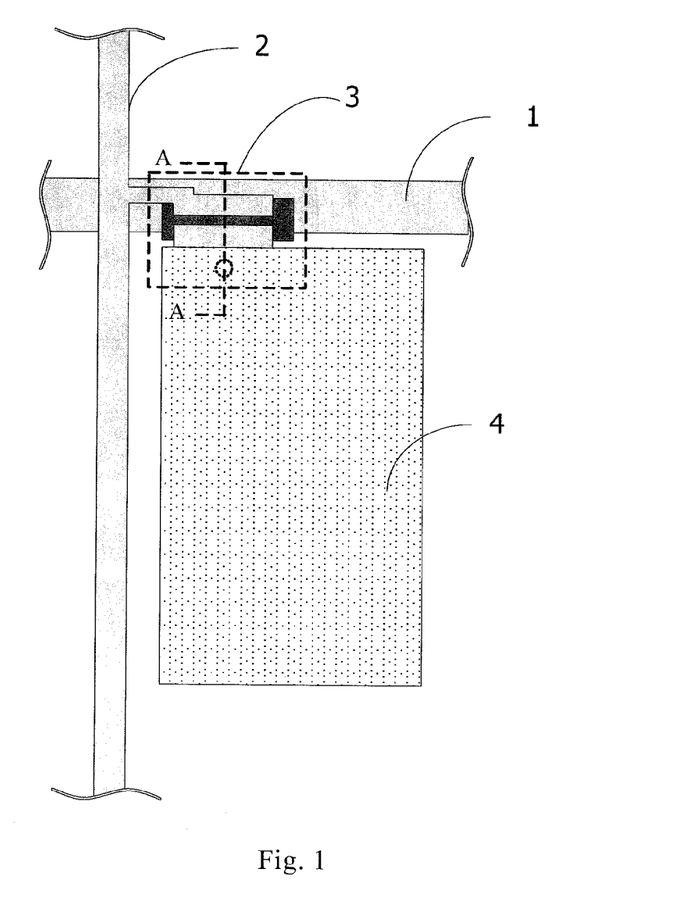
FIG. 1 is a schematic plan view of a conventional TFT-LCD array substrate.

TFT-LCDs belong to an important type of flat panel displays (FPDs). FIG. 1 is a schematic plan view of a conventional TFT-LCD array substrate. As shown in FIG. 1, the array substrate comprises a gate line 1, a data line 2, a thin film transistor (TFT) 3 and a pixel electrode 4. The gate line 1 is provided horizontally on a transparent substrate 11, the data line 2 is provided vertically on the substrate 11, and the TFT 3 is provided at an intersection of the gate line 1 and the data line 2. The TFT 3 is an active switch element.

Figure 2:
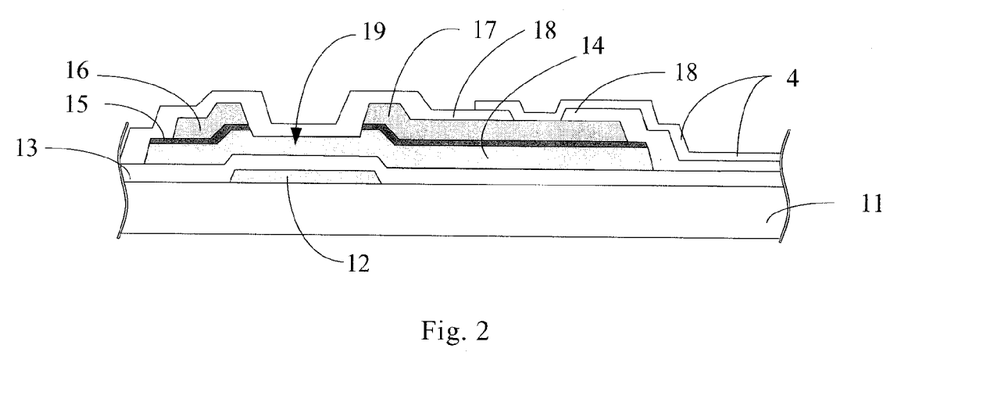
FIG. 2 is a cross-sectional view taken along a line A-A in FIG. 1.

FIG. 2 is a cross-sectional view taken along a line A-A in FIG. 1. As shown in FIG. 2, the array substrate comprises a gate electrode 12, a gate insulating layer 13, a semiconductor layer 14, a doped semiconductor layer 15, a source electrode 16, a drain electrode 17, and a passivation layer 18. The above structures are all provided on the substrate 11. The gate electrode 12 and the gate line 1 are formed integrally, the source electrode 16 and the data line 2 are formed integrally, and the drain electrode 17 and the pixel electrode 4 are connected with each other through a via hole formed in the passivation layer. When the gate line 1 is input with an "ON" signal, an active layer (including the stack of the semiconductor layer 14 and the doped semiconductor layer 15) becomes conductive, a data signal over the data line 2 is transmitted from the source electrode 16 to the drain electrode 17 through a TFT channel 19, and the data signal is finally transmitted to the pixel electrode 4. The pixel electrode 4 applied with the data signal generates an electrical field together with a common electrode (not shown), which is provided on the array substrate or a color filter substrate facing the array substrate, depending on the type of the TFT-LCD, so as to drive the rotation of the liquid crystal material.

Currently, a TFT-LCD is manufactured by forming structure patterns with patterning processes. Each patterning process comprises steps such as applying photoresist, exposing and developing the photoresist, etching with a photoresist pattern, and removing remaining photoresist. The etching process may comprise a dry etching method or a wet etching method. Therefore, the times of the patterning processes can be used to evaluate the complexity of the manufacturing method of a TFT-LCD array substrate, and reducing the times of the patterning processes means reducing manufacturing cost.

To reduce the number of the employed patterning process, the combination of a dual tone masking process and a lifting-off process is typically applied. A dual tone mask can adjust the amount of penetrating light across the mask and thus selectively control the heights across the formed photoresist pattern. With the photoresist pattern, more than one etching process can be performed.

For example, when the combination of a dual tone masking process and a lifting-off process is used to form a pixel electrode, a faultage or step is formed at the edge of the pixel electrode pattern when depositing the transparent conductive layer so that the subsequent lifting off process can be implemented. An under cut (a bevel edge inclining inwardly) can be formed along the edges of the photoresist pattern when etching the passivation layer. After forming the under cut of the photoresist pattern, the transparent conductive layer deposited on the photoresist pattern fauns a faultage at the under cut so as to expose the under cut of the photoresist pattern. At this time, the photoresist pattern together with the transparent conductive layer on the photoresist pattern can be lifted off from the under cut so as to obtain the pattern of the pixel electrode. This method is called as lifting-off process.

However, an ashing process is carried out after the under cut is formed when the second insulating layer is etched, thus it is difficult to maintain the under cut of the photoresist pattern. In addition, the problem of forming the under cut to different extents (i.e., the different degrees of inward inclination of the bevels) may occur. Therefore, the possibility of fault lifting-off increases, and the product yield decreases accordingly. In addition, when the ashing process is carried out on photoresist, the transparent conductive layer may be contaminated, which brings about a high defective ratio and corresponding complicated treatment procedures.

SUMMARY

An embodiment of the invention provides a manufacturing method for a thin film transistor liquid crystal display (TFT-LCD) array substrate, the array substrate including a gate electrode region, a data line region, a semiconductor region, a source electrode region, a drain electrode region, a gate line region and a pixel electrode region. The manufacturing method comprises: Step 1, depositing a transparent conductive film, a source/drain metal film and a doped semiconductor film on a transparent substrate sequentially, forming patterns of a doped semiconductor layer, a source electrode and a drain electrode of a thin film transistor, a data line and a pixel electrode by a first patterning process, wherein the doped semiconductor layer remains on the source electrode and the drain electrode; Step 2, depositing a semiconductor film on the whole transparent substrate after Step 1, forming a pattern of a semiconductor layer which includes a channel of the thin film transistor by a second patterning process; Step 3, depositing an insulating film and a gate metal film on the whole transparent substrate after Step 2, forming patterns of a gate line and a gate electrode of the thin film transistor by a third patterning process, wherein the gate electrode is located above the channel of the thin film transistor.

Another embodiment of the invention provides a TFT-LCD array substrate manufactured by the above manufacturing method for the TFT-LCD array substrate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

The embodiments of the invention will be in detail described with reference to the accompanying drawings.

In the embodiments of the invention, the description of X being on Y or the like comprises the cases where X contacts with Y or X is provided above Y with an intermediate layer therebetween. For the embodiments of the invention shown in the drawings, a transparent substrate is provided or defined as the lowermost layer.

A patterning process in the embodiments of the invention comprises applying photoresist, exposing and developing the photoresist, etching with a photoresist pattern, and removing the remaining photoresist. Positive photoresist is employed as an example.

The term "X region" in the description means a region projected on the transparent substrate by vertically projecting the "X pattern" from up to down, that is to say, the X region has the same shape as the X pattern. For example, a gate line region is a region by projecting the pattern of the gate line on the transparent substrate, in other words, it can be comprehended as a region on the transparent substrate, in which the pattern of the gate line is provided.

Figure 3:
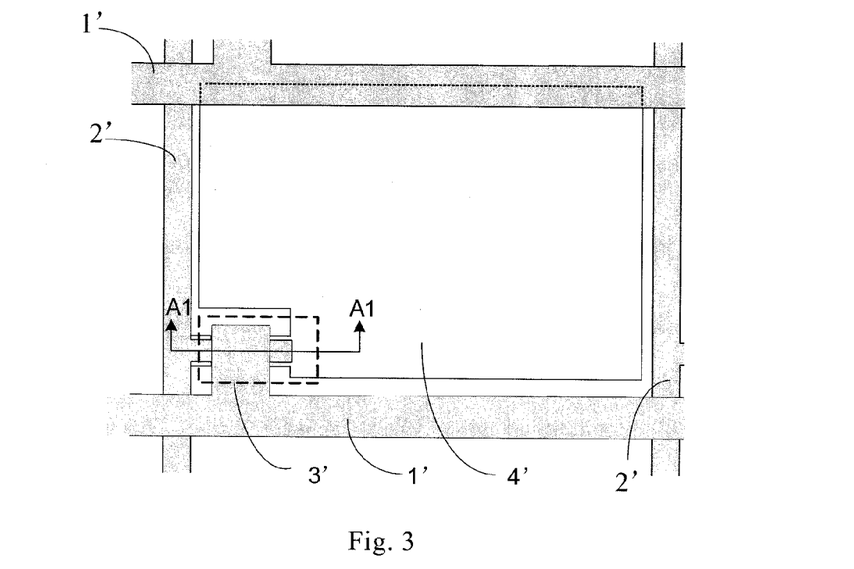
FIG. 3 is a plan view of a TFT-LCD array substrate according to an embodiment of the invention.

FIG. 3 is a plan view of a TFT-LCD array substrate according to an embodiment of the invention. As shown in FIG. 3, the TFT-LCD array substrate according to the embodiment of the invention mainly comprises a gate line 1', a data line 2', a thin film transistor (TFT) 3' and a pixel electrode 4'. The gate line 1' and the data line 2' perpendicular with each other define a pixel unit, and the TFT 3' and the pixel electrode 4' are provided within the pixel unit. The gate line 1' is used to supply an "ON" signal to the TFT 3', and the data line 2' is used to supply a data signal to the pixel electrode 4'. The TFT 3' is an active switch element.

Figure 4:
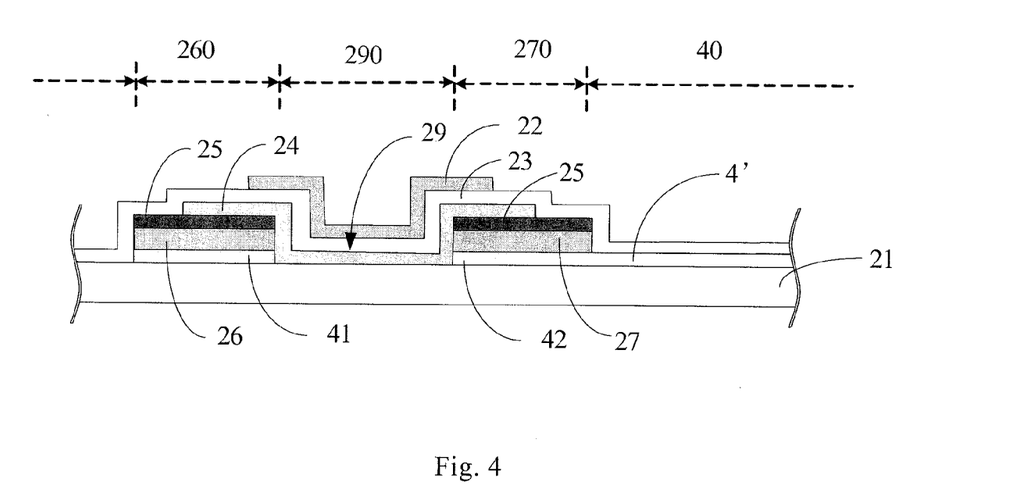
FIG. 4 is a cross-sectional view taken along a line A1-A1 in FIG. 3.

FIG. 4 is a cross-sectional view taken along a line A1-A1 in FIG. 3, which shows a structure of the TFT. As shown in FIG. 4, the structure of the TFT according to the embodiment of the invention comprises a transparent substrate 21, a first transparent conductive portion 41, a second transparent conductive portion 42, a source electrode 26, a drain electrode 27, a doped semiconductor layer 25, a semiconductor layer 24, a gate insulating layer 23, and a gate electrode 22. The first transparent conductive portion 41 is provided in a source electrode region 260, and the first transparent conductive portion 41 is not connected with the pixel electrode 4'. A source electrode 26 is provided on the first transparent conductive portion 41. The second transparent conductive portion 42 is provided in the drain electrode region 270, and the second transparent conductive portion 42 is formed integrally with the pixel electrode 4'. A drain electrode 27 is provided on the second transparent conductive portion 42. A doped semiconductor layer 25 is provided on the source electrode 26 and the drain electrode 27, and a TFT channel region is provided between the drain electrode 26 and the drain electrode 27. A semiconductor layer 24 is provided on the doped semiconductor layer 25 and on the TFT channel region 290 so as to from a TFT channel 29. The gate insulating layer 23 is provided on the structure obtained with the above processes and covers the whole transparent substrate 21. A gate electrode 22 is provided on the gate insulating layer 23 and located above the TFT channel region, and the gate electrode 22 is connected with the gate line 1'.

The above embodiment of the invention relates to a top gate structure TFT, which can be manufactured by a three-patterning-process and has advantages such as simple manufacturing process, short processing time, high product yield and low cost. In addition, the embodiment of the invention dose not need a lifting off process and thus decreases the process difficulty and increases the product yield.

FIGS. 5-18 show the manufacturing processes for the TFT-LCD array substrate according to the embodiment of the invention.

Figure 5:
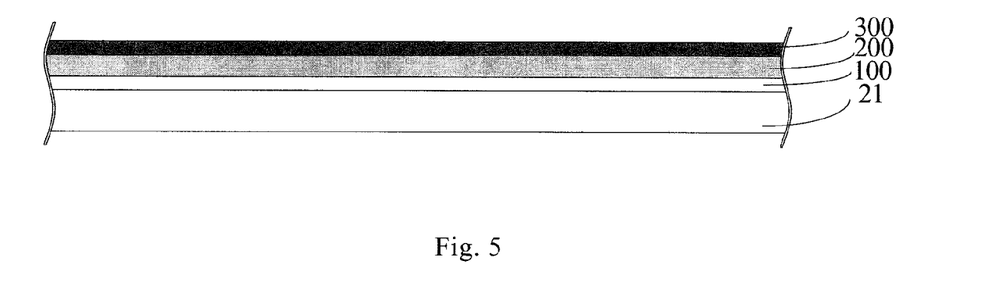
FIG. 5 is a cross-sectional view after depositing a transparent conductive film, a source/drain metal film and a doped semiconductor film on a transparent substrate.

FIG. 5 is a cross-sectional view after depositing a transparent conductive film, a source/drain metal film and a doped semiconductor film on a transparent substrate. As shown in FIG. 5, firstly, the transparent conductive film 100, the source/drain metal film 200 and the doped semiconductor film 300 are sequentially deposited on the transparent substrate 21 (such as a glass substrate or a silica substrate) by a plasma enhanced chemical vapor deposition (PECVD) method, a magnetic sputtering method, a thermal evaporation method or other film-forming method. The source/drain electrode metal film 200 may be a single-layer film formed of a metal material such as molybdenum, aluminum, aluminum-neodymium alloy, tungsten, chromium, copper, or a multiple-layer film formed by any combination of the above metals. The transparent conductive film 100 may be indium tin oxide (ITO), indium zinc oxide (IZO), etc.

Figure 6:
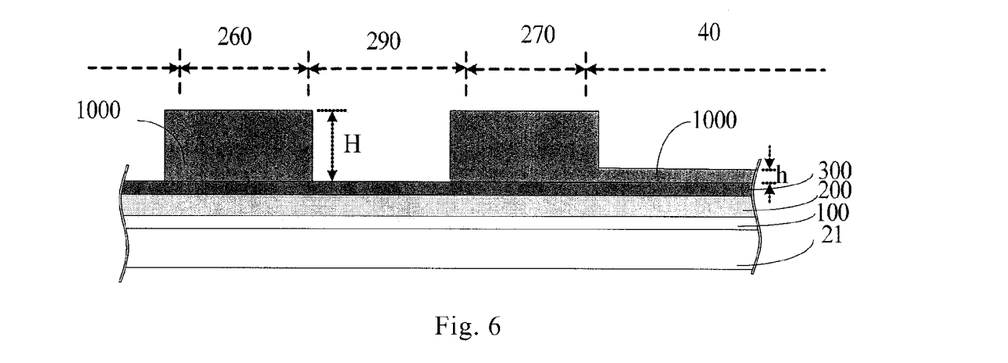
FIG. 6 is a cross-sectional view after applying photoresist on the structure of FIG. 5, exposing and developing the photoresist.

FIG. 6 is a cross-sectional view after applying photoresist on the structure of FIG. 5, exposing and developing the photoresist. As shown in FIG. 6, a layer of photoresist 1000 is applied on the doped semiconductor film 300, and the photoresist 1000 is exposed with a dual tone mask (such a half tone mask or a grey tone mask) and then is developed, so that the photoresist 1000 in the data line region (not shown), the source electrode region 260 and the drain electrode region 270 has a first thickness H, and the photoresist 1000 in the pixel electrode region 40 has a second thickness h. The first thickness H is larger than the second thickness h. In addition, there is no photoresist in the remaining regions.

Figure 7:
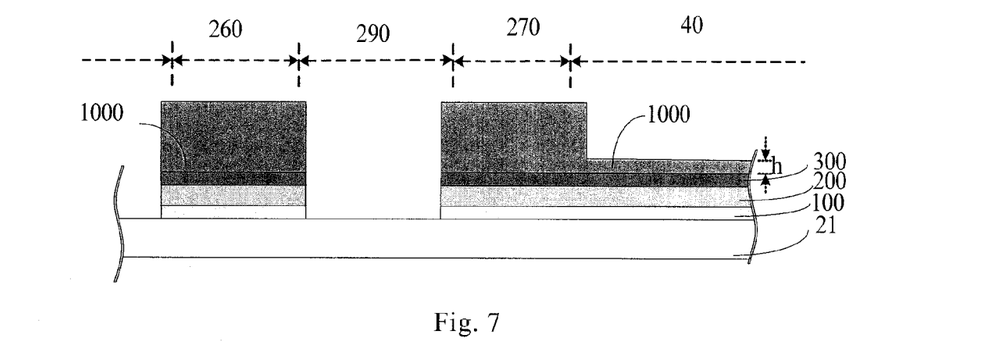
FIG. 7 is a cross-sectional view after performing a first etching process on the structure of FIG. 6.

FIG. 7 is a cross-sectional view after performing a first etching process on the structure of FIG. 6. As shown in FIG. 7, with the formed pattern of the photoresist as an etching mask, the semiconductor film 300, the source/drain metal film 200 and the transparent conductive film 100 in the remaining region other than the pixel electrode region 40, the data line region, the source electrode region 260 and the drain electrode region 270 are removed by the first etching process, i.e., the semiconductor film 300, the source/drain metal film 200 and the transparent conductive film 100 in the remaining regions not covered by the photoresist 1000 are removed. Specifically, the doped semiconductor layer 300 (n+ a-Si:H) is etched, for example, by an mixture gas including $SF_6$, HCl, $Cl_2$ and He; the source/drain metal film 200 is etched by an etching agent by mixing phosphoric acid and nitric acid; and the transparent conductive film 100 (ITO or IZO) is etched by an etching agent such as sulfuric acid or peroxide.

When Mo or Mo/Al/Mo layer that can be processed by a dry etching method is used as the source/drain metal film 200, the doped semiconductor film 300 and the source/drain metal film 200 may be etched with, for example, two consecutive dry etching processes, or a dry etching followed by a wet etching. The etching method may be varied according to the different kinds of source/drain metal films.

Figure 8:
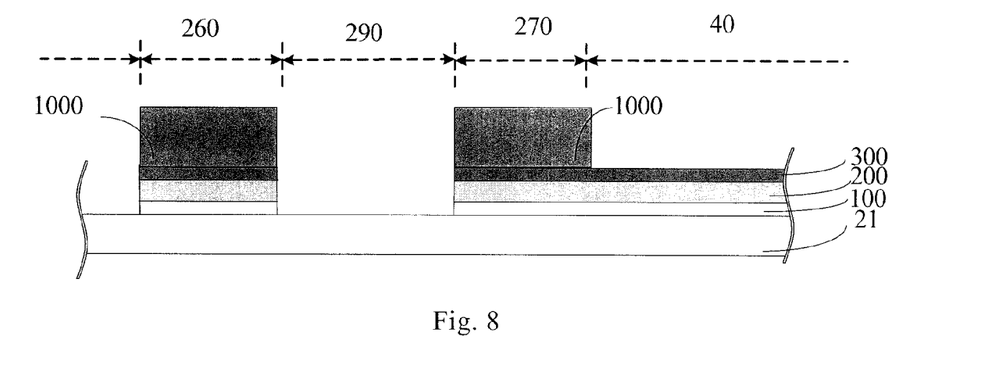
FIG. 8 is a cross-sectional view after performing an ashing process on the photoresist in FIG. 7.

FIG. 8 is a cross-sectional view after performing an ashing process on the photoresist in FIG. 7. As shown in FIG. 8, the part of the photoresist 1000 of the second thickness h is removed by performing an ashing process on the photoresist, so as to expose the doped semiconductor film 300 in the pixel electrode region 40. The remaining part of the photoresist 1000 is thinned by a thickness h correspondingly.

Figure 9:
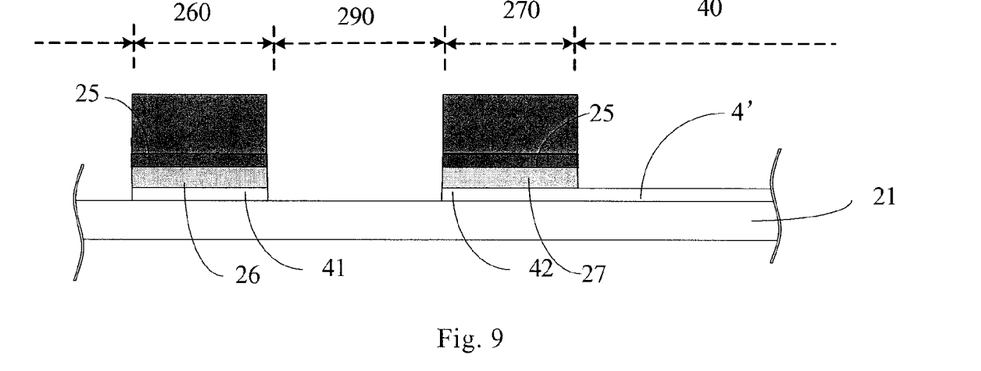
FIG. 9 is a cross-sectional view after performing a second etching process on the structure of FIG. 8.

FIG. 9 is a cross-sectional view after performing a second etching process on the structure of FIG. 8. As shown in FIG. 9, the doped semiconductor film 300, the source/drain electrode film 200 in the pixel region 40 are removed by a second etching process so as to form a first transparent conductive portion 41, a second transparent conductive portion 42, a pixel electrode 4', a source electrode 26, a drain electrode 27 and a doped semiconductor layer 25.

Figure 10:
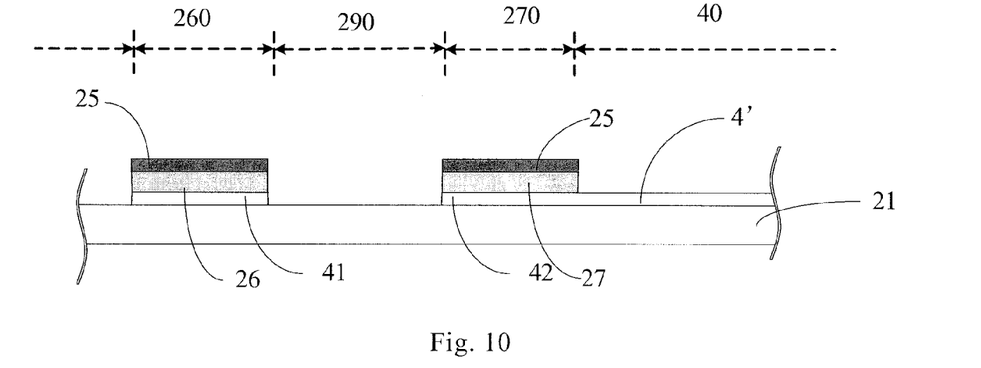
FIG. 10 is a cross-sectional view after removing the remaining photoresist from the structure of FIG. 9.

FIG. 10 is a cross-sectional view after removing the remaining photoresist from the structure of FIG. 9.

Here, the first patterning process is completed with reference to FIG. 5 to FIG. 10.

Figure 11:
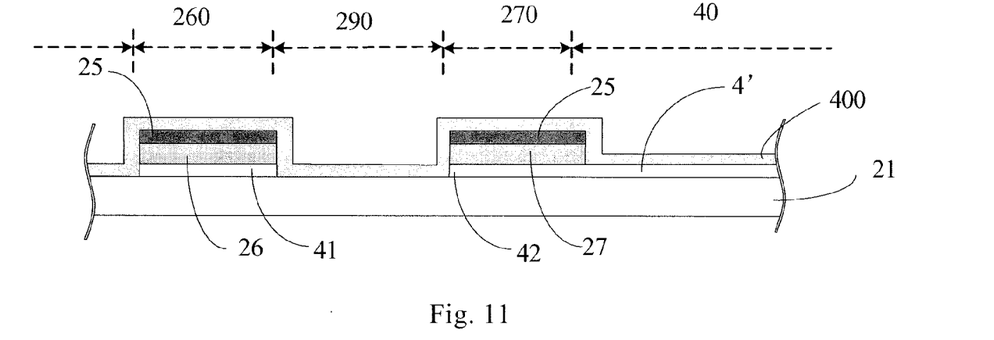
FIG. 11 is a cross-sectional view after depositing a semiconductor film on the structure of FIG. 10.

FIG. 11 is a cross-sectional view after depositing a semiconductor film on the structure of FIG. 10. A layer of semiconductor film 400 may be deposited by a PECVD method or other film-forming method. After the deposition, in the data line region, the source electrode region 260 and the drain electrode region 270, a semiconductor film 400 is deposited on the doped semiconductor layer 25; in the pixel electrode region 40, the semiconductor film 400 is deposited on the pixel electrode 4'; in other regions (including the TFT channel region 290), the semiconductor film 400 is deposited on the transparent substrate 21.

Figure 12:
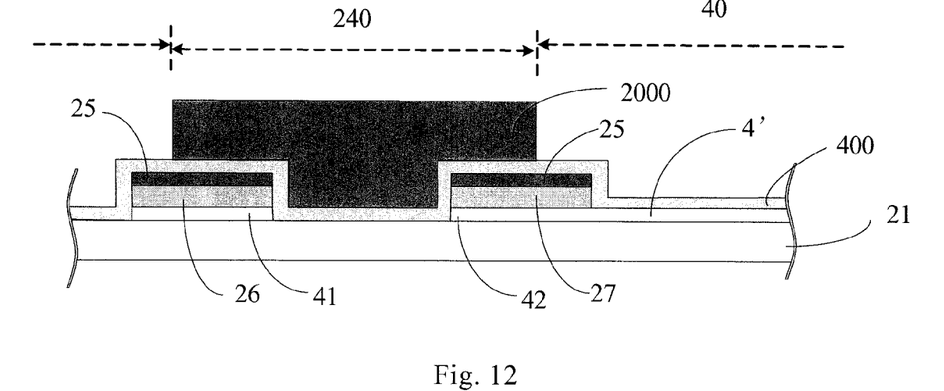
FIG. 12 is a cross-sectional view after forming a photoresist pattern on the structure of FIG. 11.

FIG. 12 is a cross-sectional view after applying photoresist on the structure of FIG. 11. Photoresist 2000 is applied on the semiconductor film 400, then is exposed with a normal mask and is developed. In result, the photoresist 2000 covers the semiconductor region 240 and there is no photoresist remaining in other regions. As shown in FIG. 12, the semiconductor region 240 comprises the TFT channel region 290 and entire or a part of the source electrode region 260 and the drain electrode region 270.

Figure 13:
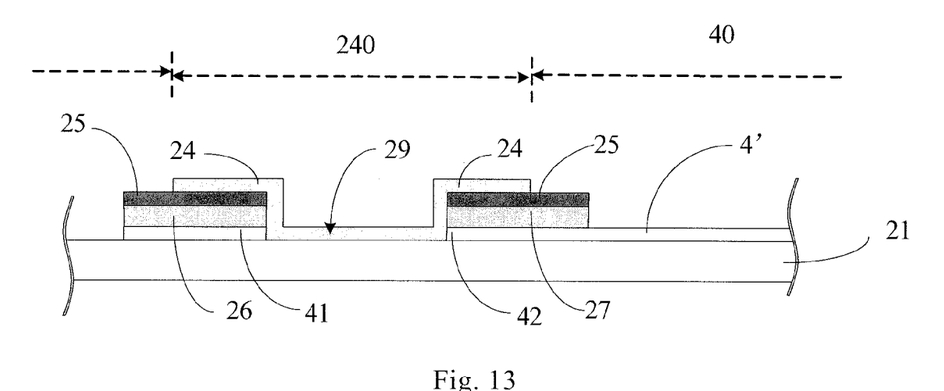
FIG. 13 is a cross-sectional view after performing an etching process and removing the photoresist pattern on the structure of FIG. 12.

FIG. 13 is a cross-sectional view after performing an etching process on the structure of FIG. 12. As shown in FIG. 13, the semiconductor film 400 that is not covered by the photoresist is removed so as to form a pattern of the semiconductor layer 24. In FIG. 13, the semiconductor layer 24 is formed on the TFT channel region 290 and a part of the source electrode region 260 and a part of the drain electrode region 270. The semiconductor layer 24 on the TFT channel region 290 is formed into a TFT channel 29. Then, the remaining photoresist as shown in FIG. 12 is removed.

Here, the second patterning process is completed with reference to FIG. 11 to FIG. 13.

Figure 14:
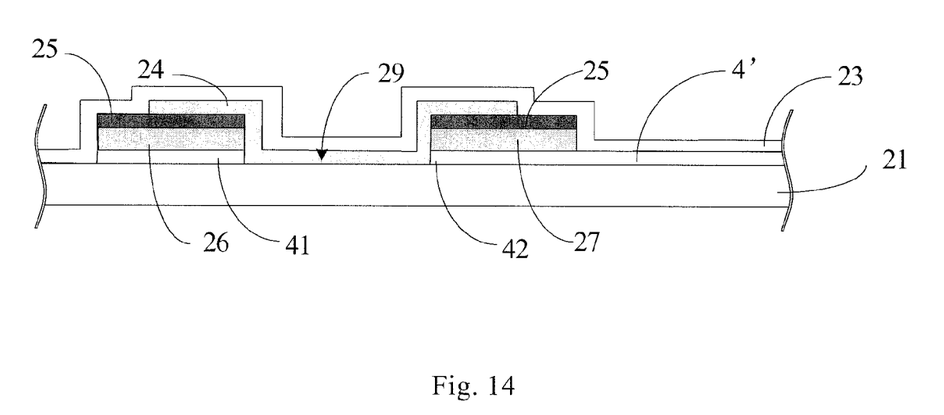
FIG. 14 is a cross-sectional view after depositing an insulating film on the structure of FIG. 13.

FIG. 14 is a cross-sectional view after depositing an insulating film on the structure of FIG. 13. As shown in FIG. 14, on the whole transparent substrate 21, a layer of insulating film is deposited by a PECVD method or other film-forming method so as to form a gate insulating layer 23. The insulating film may be a single-layer film of SiNx, SiOx or SiOxNy, or a multi-layer film formed of any combination of the above materials.

Figure 15:
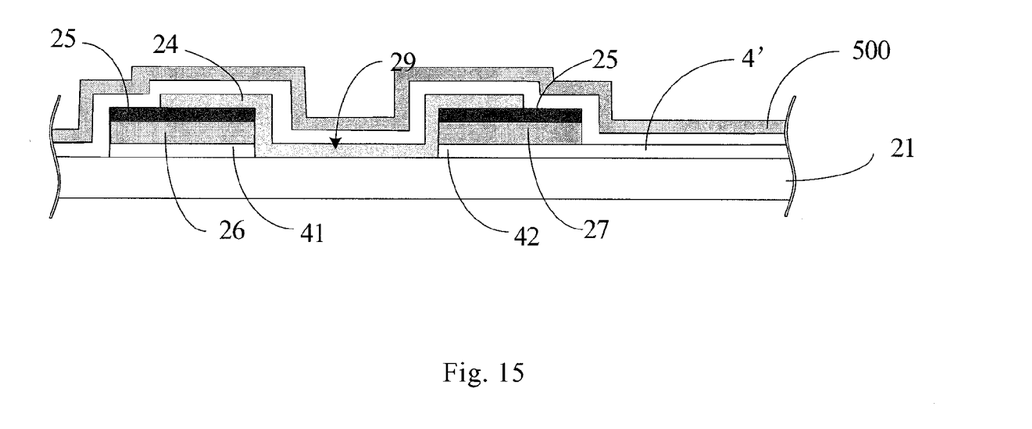
FIG. 15 is a cross-sectional view after depositing a gate metal film on the structure of FIG. 14.

FIG. 15 is a cross-sectional view after depositing a gate metal film on the structure of FIG. 14. As shown in FIG. 15, a gate metal film 500 is deposited by a magnetic sputtering method, a thermal evaporation method or other film-forming method. The gate metal film 500 may be a single-layer film of molybdenum, aluminum, aluminum-neodymium alloy, tungsten, chromium, copper, or a multiple-layer film formed of any combination of the above metal materials.

Figure 16:
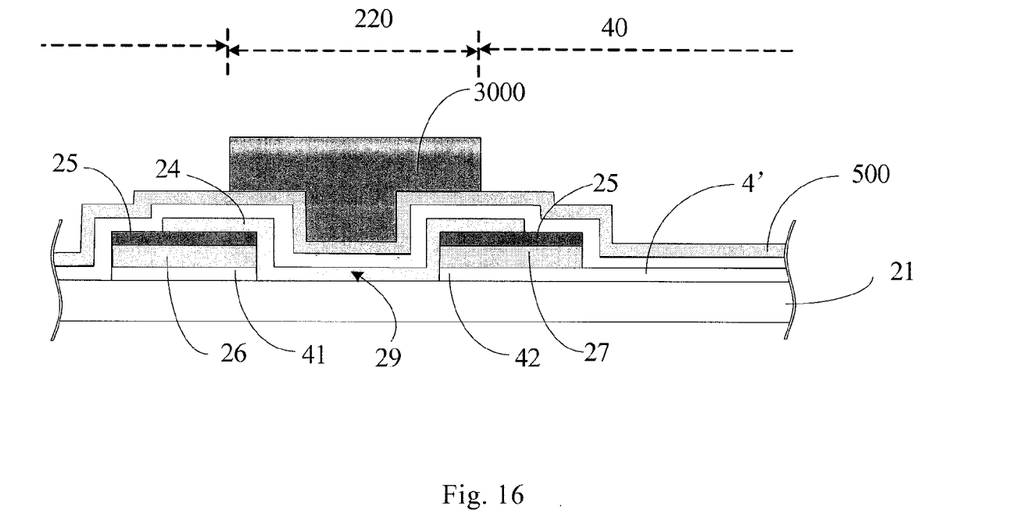
FIG. 16 is a cross-sectional view after forming a photoresist pattern on the structure of FIG. 15.

FIG. 16 is a cross-sectional view after applying photoresist on the structure of FIG. 15. As shown in FIG. 16, photoresist 3000 is applied on the gate metal film 500, then is exposed with a normal mask and developed, so that the photoresist 3000 covers the gate line region (not shown) and the gate electrode region 220, and there is no photoresist remaining in other regions. The gate electrode region 220 comprises the entire TFT channel region 290 and entire or a part of the source electrode region 260 and the drain electrode 270.

Figure 17:
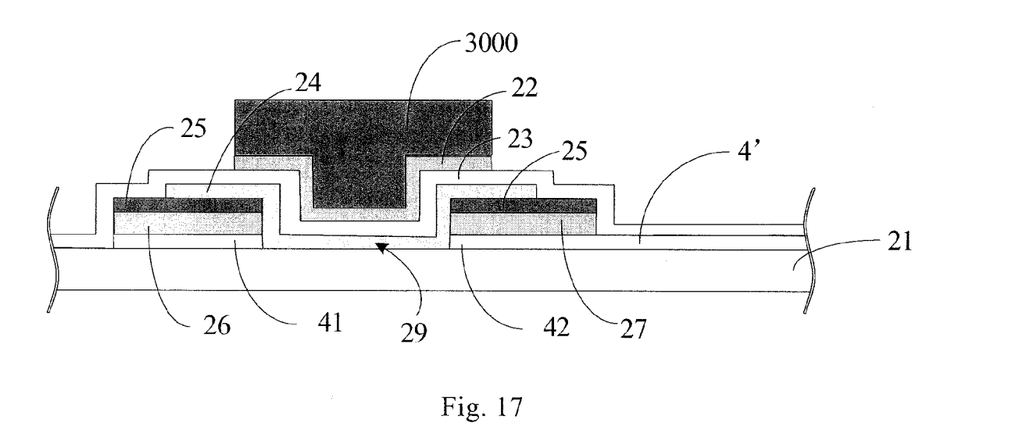
FIG. 17 is a cross-sectional view after performing an etching process on the structure of FIG. 16.

FIG. 17 is a cross-sectional view after performing an etching process on the structure of FIG. 16. As shown in FIG. 17, the gate metal film 500 not covered by the photoresist 3000 is removed with an etching agent, so as to form patterns of a gate electrode 22 and a gate line (not shown).

Figure 18:
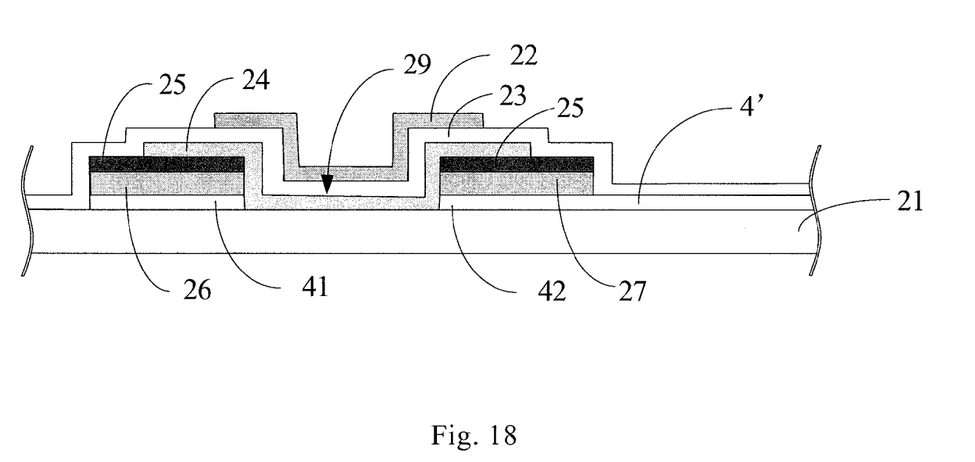
FIG. 18 is a cross-sectional view after removing the photoresist in FIG. 17.

FIG. 18 is a cross-sectional view after removing the photoresist in FIG. 17.

Thus, the third patterning process is completed with reference to FIG. 14 to FIG. 18, so as to obtain the TFT-LCD array substrate according to the embodiment of the invention.

Since the ashing process on the photoresist is performed after depositing the transparent conductive film, the source/drain metal film and the doped semiconductor film, the embodiment of the invention can avoid contamination on the transparent conductive layer due to an ashing process and increase the product yield compared with the method in which the transparent conductive layer is deposited after an ashing process.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:
1. A manufacturing method for a thin film transistor liquid crystal display (TFT-LCD) array substrate, the array substrate including a gate electrode region, a data line region, a semiconductor region, a source electrode region, a drain electrode region, a gate line region and a pixel electrode region, wherein the manufacturing method comprises:

Step 1, depositing a transparent conductive film, a source/drain metal film and a doped semiconductor film on a transparent substrate sequentially, forming patterns of a doped semiconductor layer, a source electrode and a drain electrode of a thin film transistor, a data line and a pixel electrode by a first patterning process, wherein the doped semiconductor layer remains on the source electrode and the drain electrode;

Step 2, depositing a semiconductor film on the whole transparent substrate after Step 1, forming a pattern of a semiconductor layer that includes a channel of the thin film transistor by a second patterning process; and Step 3, depositing an insulating film and a gate metal film on the whole transparent substrate after Step 2, forming patterns of a gate line and a gate electrode of the thin film transistor by a third patterning process, wherein the gate electrode is located above the channel of the thin film transistor, wherein step 1 comprises:

after depositing the transparent conductive film, the source/drain metal film and the doped semiconductor film on the transparent substrate sequentially, applying a first photoresist layer on the doped semiconductor film;

exposing the first photoresist layer with a dual tone mask and developing the exposed first photoresist layer so that the first photoresist layer in the data line region, the source electrode region and the drain electrode region has a first thickness, the first photoresist layer in the pixel electrode region has a second thickness which is smaller than the first thickness, and the first photoresist layer does not remain in remaining regions;

removing the doped semiconductor film, the source/drain metal film and the transparent conductive film in the remaining regions by a first etching process;

removing the first photoresist layer with the second thickness by an ashing process so as to expose the doped semiconductor layer in the pixel electrode region;

removing the doped semiconductor film, the source/drain metal film in the pixel region by a second etching process; and removing the remaining first photoresist layer.

2. The manufacturing method for the TFT-LCD array substrate of claim 1, wherein step 2 comprises:

after depositing the semiconductor film on the whole transparent substrate after Step 1, applying a second photoresist layer on the semiconductor layer;

exposing the second photoresist layer with a mask and developing the exposed second photoresist layer that the second photoresist layer is only retained in the semiconductor layer region;

removing the exposed semiconductor film by a third etching process; and removing the remaining second photoresist layer.

3. The manufacturing method for the TFT-LCD array substrate of claim 1, wherein step 3 comprises:

after depositing the insulating film and the gate metal film on the whole transparent substrate after Step 2, applying a third photoresist layer on the gate metal film;

exposing the third photoresist layer with a mask and developing the exposed third photoresist layer so as to the third photoresist layer is only retained in the gate electrode region and the gate line region;

removing the exposed gate metal film by a fourth etching process; and removing the remaining third photoresist layer.

4. The manufacturing method for the TFT-LCD array substrate of claim 1, wherein the insulating film is a single-layer film of SiNx, SiOx or SiOxNy, or a multi-layer film formed of any combination of the above materials.

5. The manufacturing method for the TFT-LCD array substrate of claim 1, wherein the source/drain metal film is a single-layer film formed of a metal material of molybdenum, aluminum, aluminum-neodymium alloy, tungsten, chromium, copper, or a multiple-layer film formed of any combination of the above metal materials.

6. The manufacturing method for the TFT-LCD array substrate of claim 1, wherein the gate metal film is a single-layer film formed of a metal material of molybdenum, aluminum, aluminum-neodymium alloy, tungsten, chromium, copper, or a multiple-layer film formed of any combination of the above metal materials.

7. The manufacturing method for the TFT-LCD array substrate of claim 1, wherein the source/drain metal film is etched by an etching agent by mixing phosphoric acid and nitric acid.

8. The manufacturing method for the TFT-LCD array substrate of claim 1, wherein the transparent conductive film is etched by sulfuric acid or peroxide.

9. The manufacturing method for the TFT-LCD array substrate of claim 5, wherein the source/drain metal film comprises Mo or a Mo/Al/Mo stack layer, and the doped semiconductor film and the source/drain metal film are etched by two consecutive dry etching processes.

10. A thin film transistor liquid crystal display (TFT-LCD) array substrate manufactured by the manufacturing method for the TFT-LCD array substrate of claim 1.

11. A manufacturing method for a thin film transistor liquid crystal display (TFT-LCD) array substrate, the array substrate including a gate electrode region, a data line region, a semiconductor region, a source electrode region, a drain electrode region, a gate line region and a pixel electrode region, wherein the manufacturing method comprises:

Step 1, depositing a transparent conductive film, a source/drain metal film and a doped semiconductor film on a transparent substrate sequentially, forming patterns of a doped semiconductor layer, a source electrode and a drain electrode of a thin film transistor, a data line and a pixel electrode by a first patterning process, wherein the doped semiconductor layer remains on the source electrode and the drain electrode;

Step 2, depositing a semiconductor film on the whole transparent substrate after Step 1, forming a pattern of a semiconductor layer that includes a channel of the thin film transistor by a second patterning process; and Step 3, depositing an insulating film and a gate metal film on the whole transparent substrate after Step 2, forming patterns of a gate line and a gate electrode of the thin film transistor by a third patterning process, wherein the gate electrode is located above the channel of the thin film transistor, wherein step 2 comprises:

after depositing the semiconductor film on the whole transparent substrate after Step 1, applying a second photoresist layer on the semiconductor layer;

exposing the second photoresist layer with a mask and developing the exposed second photoresist layer that the second photoresist layer is only retained in the semiconductor layer region;

removing the exposed semiconductor film by a third etching process; and removing the remaining second photoresist layer.

12. The manufacturing method for the TFT-LCD array substrate of claim 11, wherein step 1 comprises:

after depositing the transparent conductive film, the source/drain metal film and the doped semiconductor film on the transparent substrate sequentially, applying a first photoresist layer on the doped semiconductor film;

exposing the first photoresist layer with a dual tone mask and developing the exposed first photoresist layer so that the first photoresist layer in the data line region, the source electrode region and the drain electrode region has a first thickness, the first photoresist layer in the pixel electrode region has a second thickness which is smaller than the first thickness, and the first photoresist layer does not remain in remaining regions;

removing the doped semiconductor film, the source/drain metal film and the transparent conductive film in the remaining regions by a first etching process;

removing the first photoresist layer with the second thickness by an ashing process so as to expose the doped semiconductor layer in the pixel electrode region;

removing the doped semiconductor film, the source/drain metal film in the pixel region by a second etching process; and removing the remaining first photoresist layer.

13. The manufacturing method for the TFT-LCD array substrate of claim 12, wherein the source/drain metal film is etched by an etching agent by mixing phosphoric acid and nitric acid.

14. The manufacturing method for the TFT-LCD array substrate of claim 12, wherein the transparent conductive film is etched by sulfuric acid or peroxide.

15. The manufacturing method for the TFT-LCD array substrate of claim 11, wherein step 3 comprises:

after depositing the insulating film and the gate metal film on the whole transparent substrate after Step 2, applying a third photoresist layer on the gate metal film;

exposing the third photoresist layer with a mask and developing the exposed third photoresist layer so as to the third photoresist layer is only retained in the gate electrode region and the gate line region;

removing the exposed gate metal film by a fourth etching process; and removing the remaining third photoresist layer.

16. The manufacturing method for the TFT-LCD array substrate of claim 11, wherein the insulating film is a single-layer film of SiNx, SiOx or SiOxNy, or a multi-layer film formed of any combination of the above materials.

17. The manufacturing method for the TFT-LCD array substrate of claim 11, wherein the source/drain metal film is a single-layer film formed of a metal material of molybdenum, aluminum, aluminum-neodymium alloy, tungsten, chromium, copper, or a multiple-layer film formed of any combination of the above metal materials.

18. The manufacturing method for the TFT-LCD array substrate of claim 17, wherein the source/drain metal film comprises Mo or a Mo/Al/Mo stack layer, and the doped semiconductor film and the source/drain metal film are etched by two consecutive dry etching processes.

19. The manufacturing method for the TFT-LCD array substrate of claim 11, wherein the gate metal film is a single-layer film formed of a metal material of molybdenum, aluminum, aluminum-neodymium alloy, tungsten, chromium, copper, or a multiple-layer film formed of any combination of the above metal materials.

20. A thin film transistor liquid crystal display (TFT-LCD) array substrate manufactured by the manufacturing method for the TFT-LCD array substrate of claim 11.

* * * * *